(12) United States Patent
Zhang et al.

(10) Patent No.: US 12,209,215 B2
(45) Date of Patent: Jan. 28, 2025

(54) METHOD FOR PREPARING QUANTUM DOTS LIGHT-EMITTING DIODE

(71) Applicant: TCL TECHNOLOGY GROUP CORPORATION, Guangdong (CN)

(72) Inventors: Jie Zhang, Guangdong (CN); Chaoyu Xiang, Guangdong (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 783 days.

(21) Appl. No.: 17/419,495

(22) PCT Filed: Sep. 17, 2019

(86) PCT No.: PCT/CN2019/106131
§ 371 (c)(1),
(2) Date: Jun. 29, 2021

(87) PCT Pub. No.: WO2020/134201
PCT Pub. Date: Jul. 2, 2020

(65) Prior Publication Data
US 2022/0089948 A1 Mar. 24, 2022

(30) Foreign Application Priority Data
Dec. 29, 2018 (CN) .......................... 201811639647.3

(51) Int. Cl.
*C09K 11/88* (2006.01)
*C09K 11/56* (2006.01)
(Continued)

(52) U.S. Cl.
CPC .......... *C09K 11/883* (2013.01); *C09K 11/565* (2013.01); *H10K 50/115* (2023.02);
(Continued)

(58) Field of Classification Search
CPC .... C09K 11/883; C09K 11/565; H10K 50/17; H10K 71/00; H10K 50/115; H10K 50/18; H10K 71/15; H10K 50/15
See application file for complete search history.

(56) References Cited

U.S. PATENT DOCUMENTS 6,774,014 B1 * 8/2004 Lee .................. H01L 21/02601
257/E29.071
7,336,019 B1 * 2/2008 Puskas ...................... B08B 3/12
310/317

(Continued)

FOREIGN PATENT DOCUMENTS

| CN | 102903855 A | 1/2013 |
| CN | 103474584 A | 12/2013 |

(Continued)

*Primary Examiner* — Nathan T Leong

(57) ABSTRACT

The present application discloses a method for preparing quantum dots light-emitting diode, including following steps: providing a base plate, wherein an upper surface of the base plate is provided with quantum dots light-emitting layer; and immersing the base plate in a solvent system to perform an ultrasonic processing, wherein the solvent system comprises: a host solvent and doping solvent dissolved in the main, a polarity of the doping solvent is less than a polarity of the host solvent, and the host solvent is an organic solvent that does not dissolve quantum dots.

20 Claims, 1 Drawing Sheet

---

S10 — providing a base plate, and an upper surface of the base plate is provided with quantum dots light-emitting layer S20 — immersing the base plate in a solvent system to perform an ultrasonic processing, wherein the solvent system comprises: a host solvent and doping solvent dissolved in the main, a polarity of the doping solvent is less than a polarity of the host solvent, and the host solvent is an organic solvent that does not dissolve quantum dots

(51) Int. Cl.
  *H10K 50/115* (2023.01)
  *H10K 50/15* (2023.01)
  *H10K 50/17* (2023.01)
  *H10K 50/18* (2023.01)
  *H10K 71/00* (2023.01)
  *H10K 71/15* (2023.01)
  *H10K 102/00* (2023.01)

(52) U.S. Cl.
  CPC ............ *H10K 50/15* (2023.02); *H10K 50/17* (2023.02); *H10K 50/18* (2023.02); *H10K 71/00* (2023.02); *H10K 71/15* (2023.02); *H10K 2102/00* (2023.02)

(56) References Cited

U.S. PATENT DOCUMENTS

2011/0260249 A1  10/2011  Nakamura

| 2015/0274895 | A1* | 10/2015 | Okawa | C09D 183/14 |
| | | | | 523/210 |
| 2016/0325999 | A1* | 11/2016 | Zhang | C01B 32/196 |
| 2017/0153382 | A1* | 6/2017 | Wang | H01L 33/504 |

FOREIGN PATENT DOCUMENTS

| CN | 104952908 A | 9/2015 |
| CN | 105153807 A | 12/2015 |
| CN | 105355799 A | 2/2016 |
| CN | 105467682 A | 4/2016 |
| CN | 105789465 A | 7/2016 |
| CN | 106409995 A | 2/2017 |
| CN | 106753332 A | 5/2017 |
| CN | 108389979 A | 8/2018 |
| CN | 108461654 A | 8/2018 |
| EP | 2062871 A1 | 5/2009 |
| JP | 2016037489 A | 3/2016 |
| WO | 2013108037 A1 | 7/2013 |
| WO | 2016072807 A1 | 5/2016 |

* cited by examiner

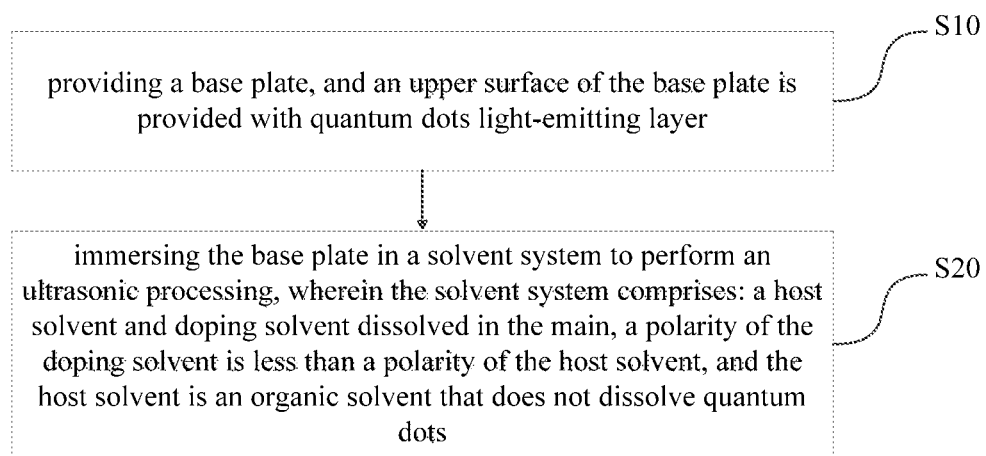

METHOD FOR PREPARING QUANTUM DOTS LIGHT-EMITTING DIODE

CROSS REFERENCE TO RELATED APPLICATION

The present application claims priority of Chinese Patent Application with application No. 201811639647.3, titled "a method for preparing quantum dots light-emitting diode", filed on Dec. 29, 2018 to CNIPA, the entire content of which is incorporated herein by reference.

TECHNICAL FIELD

The present application relates to the field of display technology, and more particularly to a method for preparing quantum dots light-emitting diode.

BACKGROUND

Quantum dots, also known as semiconductor nanocrystals, have three-dimensional dimensions in the nanometer range (1-100 nm), and belong to a kind of nanoparticle theory between bulk materials and molecules. The quantum dots have excellent optical properties such as high quantum yield, large molar extinction coefficient, good light stability, narrow half-width, wide excitation spectrum and controllable emission spectrum, and are very suitable for use as luminescent materials for light-emitting devices. In recent years, quantum dot fluorescent materials have been widely used in the field of flat panel displays due to their high light color purity, adjustable luminous color, and long service life, becoming a promising next-generation display and solid-state lighting source. Quantum dots light-emitting diodes (QLED) are light-emitting devices based on quantum dot materials as luminescent materials, which have become a strong competitor for the next generation of display technology due to their advantages such as adjustable wavelength, narrow emission spectrum, high stability, and high electroluminescence quantum yield.

However, the current method for preparing the quantum dots light-emitting diodes still needs to be improved.

TECHNICAL PROBLEM

The inventor found that during the preparing process of the QLED devices, since the quantum dots themselves inevitably contains impurities, and the impurities are introduced into the finally obtained quantum dots light-emitting layer, which affects the luminous efficiency and service life of the quantum dots light-emitting diode. The solution processing method is a common method for preparing the QLED devices, especially with the development of technology, the using of inkjet printing technology to prepare quantum dots light-emitting layer has become routine. However, when the quantum dots light-emitting layer is prepared by the solution processing method such as inkjet printing technology, part of the solvent of the quantum dot ink remains during the film formation process, especially during inkjet printing, in order to slow down the printing drying speed, a high-boiling point solvent is added to the quantum dot ink, and the residual high-boiling point solvent will also affect the luminous efficiency and service life of the quantum dots light-emitting diode.

One of the objects of the present application is to provide a method for preparing quantum dots light-emitting diode, in order to solve the problem of impurities (Impurities introduced by the quantum dot itself and/or impurities formed by solvent residues) in the quantum dots light-emitting layer when preparing the quantum dots light-emitting diodes, which affect the luminous efficiency and service life of quantum dots light-emitting diodes.

SUMMARY

In order to solve above technical problem, the technical solution adopted by embodiments of the present application as follows:

In a first aspect, a method for preparing quantum dots light-emitting diode is provided, the method includes the following steps:

providing a base plate, and an upper surface of the base plate is provided with quantum dots light-emitting layer; and immersing the base plate in a solvent system to perform an ultrasonic processing, the solvent system includes: a host solvent and doping solvent dissolved in the main, a polarity of the doping solvent is less than a polarity of the host solvent, and the host solvent is an organic solvent that does not dissolve quantum dots.

In an embodiment, the host solvent is one or a combination of two selected from a group consisting of alcohols with less than 20 carbon atoms in a straight chain, esters with less than 20 carbon atoms in a straight chain, and ketones with less than 20 carbon atoms in a straight chain.

In an embodiment, the alcohols with less than 20 carbon atoms in the straight chain is one or more selected from a group consisting of 1-propanol, 1-butanol, 1-pentanol, 2-pentanol, 1,5-pentanediol, and 2,3-butanediol;

the esters with less than 20 carbon atoms in the straight chain is one or more selected from a group consisting of ethyl acetate, ethyl propionate, ethyl methacrylate, and ethyl benzoate;

the ketones with less than 20 carbon atoms in the straight chain is one or more selected from a group consisting of acetone, methyl ethyl ketone, 3-pentanone, and 2-methyl 4-octanone;

the alcohol derivative with less than 10 carbon atoms in the straight chain is one or more selected from a group consisting of methoxyethanol, ethoxyethanol, and ethyl mandelate.

In an embodiment, the doping solvent is one or more selected from a group consisting of unsaturated fatty acids with less than 10 carbon atoms in the straight chain, alcohol derivatives with less than 10 carbon atoms in the straight chain, saturated acids with less than 10 carbon atoms in the straight chain, acid derivatives with less than 15 carbon atoms in the straight chain, and halogenated hydrocarbons with less than 20 carbon atoms in the straight chain.

In an embodiment, the unsaturated fatty acids with less than 10 carbon atoms in the straight chain is one or more selected from a group consisting of acrylic acid, crotonic acid, methacrylic acid, and 3-pentenoic acid;

the alcohol derivatives with less than 10 carbon atoms in the straight chain is one or more selected from a group consisting of methoxyethanol, ethoxyethanol, 2-hydroxy-2-phenylacetate, and acetol;

the saturated acids with less than 10 carbon atoms in the straight chain is one or more selected from a group consisting of acetic acid, propionic acid, butyric acid, and valeric acid;

the acid derivatives with less than 15 carbon atoms in the straight chain is one or more selected from a group consisting of perfluorooctanoic acid, perfluorodecylphosphonic acid, and perfluorododecanoic acid;

the halogenated hydrocarbons with less than 20 carbon atoms in the straight chain is one or more selected from a group consisting of fluoropropane, 1-chlorobutane, and 1-chloropropane, and 3-fluorohexane.

In an embodiment, when taking a total weight of the solvent system as 100% in count, a weight percentage of the doping solvent is 0.001-0.5%.

In the step of immersing the base plate in a solvent system to perform the ultrasonic processing, a frequency of the ultrasonic processing is ranged from 20 kHz to $10^9$ kHz.

In an embodiment, in the step of immersing the base plate in a solvent system to perform the ultrasonic processing, the frequency of the ultrasonic processing is ranged from 20 kHz to 100 kHz.

In an embodiment, in the step of immersing the quantum dots light-emitting layer in a solvent system to perform the ultrasonic processing, the power density of the ultrasonic processing is ranged from 0.3 w/cm$^2$ to 200 w/cm$^2$.

In an embodiment, in the step of immersing the quantum dots light-emitting layer in a solvent system to perform the ultrasonic processing, a power density of the ultrasonic processing is ranged from 5 w/cm$^2$ to 200 w/cm$^2$.

In an embodiment, in the step of immersing the quantum dots light-emitting layer in a solvent system to perform the ultrasonic processing, a duration of the ultrasonic processing is ranged from 20 minutes to 48 hours.

In an embodiment, in the step of immersing the quantum dots light-emitting layer in a solvent system to perform the ultrasonic processing, the duration of the ultrasonic processing is ranged from 1 hour to 10 hours.

In an embodiment, the base plate is a base plate provided with a bottom electrode.

In an embodiment, the bottom electrode is an anode, and before preparing the quantum dots light-emitting layer, the method further includes a step of preparing a hole functional layer on the anode surface of the base plate; and the hole functional layer comprises at least one layer selected from a group consisting of a hole injection layer, a hole transport layer, and an electron blocking layer.

In an embodiment, the bottom electrode is an anode, and before preparing a cathode, the method further includes a step of preparing an electron function layer on a side of the quantum dots light-emitting layer facing away from the anode; and the electron function layer comprises at least one layer selected from a group consisting of an electron injection layer, an electron transport layer, and a hole blocking layer.

The method for preparing the quantum dots light-emitting diode provided in the embodiments of the present application has the beneficial effect that: after the quantum dots light-emitting layer is prepared, the quantum dots light-emitting layer is immersed in a solvent system for ultrasonic processing. The solvent system includes the host solvent and the doping solvent dissolved in the host solvent, the polarity of the doping solvent is less than the polarity of the host solvent, and the host solvent is an organic solvent that does not dissolve quantum dots. Through the ultrasonic processing, the solvent system penetrates into the quantum dots light-emitting layer, the impurities (impurities introduced by the quantum dot itself and/or impurities formed by solvent residues) in the quantum dots light-emitting layer are dissolved, thereby removing the influence of the residual impurities to the luminous efficiency and service life of the quantum dots light-emitting diode, and the luminous efficiency and service life of the quantum dots light-emitting diode will be ultimately improved.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

FIG. 1 is a flowchart schematic view of a method for preparing quantum dots light-emitting diode provided by an embodiment of present application.

DETAILED DESCRIPTION

In order to make the objectives, technical solutions, and advantages of the present application clearer, the following further describes the present application in detail with reference to the accompanying drawings and embodiments. It should be understood that the specific embodiments described here are only used to explain the present application, and are not used to limit the present application.

It should be noted that the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features. In the description of the present application, "multiple" means two or more than two, unless otherwise specifically defined.

In order to illustrate the technical solutions described in the present application, the detailed description will be given below in conjunction with specific drawings and embodiments.

As shown in FIG. 1, embodiments of the present application provide a method for preparing the quantum dots light-emitting diode, which includes the following steps:

S10: providing a base plate, and an upper surface of the base plate is provided with quantum dots light-emitting layer; and S20: immersing the base plate in a solvent system to perform an ultrasonic processing, the solvent system includes: a host solvent and doping solvent dissolved in the main, a polarity of the doping solvent is less than a polarity of the host solvent, and the host solvent is an organic solvent that does not dissolve quantum dots.

The method for preparing the quantum dots light-emitting diode provided in the embodiments of the present application has the beneficial effect that: after the quantum dots light-emitting layer is prepared, the quantum dots light-emitting layer is immersed in a solvent system for ultrasonic processing. The solvent system includes the host solvent and the doping solvent dissolved in the host solvent, the polarity of the doping solvent is less than the polarity of the host solvent, and the host solvent is an organic solvent that does not dissolve quantum dots. Through the ultrasonic processing, the solvent system penetrates into the quantum dots light-emitting layer, the impurities (impurities introduced by the quantum dot itself and/or impurities formed by solvent residues) in the quantum dots light-emitting layer are dissolved, thereby removing the influence of the residual impurities to the luminous efficiency and service life of the quantum dots light-emitting diode, and the luminous efficiency and service life of the quantum dots light-emitting diode will be ultimately improved.

Specifically, the quantum dots light-emitting diodes are divided into a positive structure and an inverse structure. The positive structure includes an anode and a cathode stacked arranged, and a quantum dots light-emitting layer arranged between the anode and the cathode. The anode of the positive structure is arranged on the base plate, and hole functional layers such as the hole injection layer, the hole injection layer, and the electron blocking layer and so on can also be arranged between the anode and the quantum dots light-emitting layer, and hole functional layers such as the electron transport layer, the electron injection layer, and the hole blocking layer and so on can also be arranged between the cathode and the quantum dots light-emitting layer. The inverse structure includes an anode and a cathode stacked arranged, and a quantum dots light-emitting layer arranged between the anode and the cathode. The anode of the inverse structure is arranged on the base plate, and hole functional layers such as the hole injection layer, the hole injection layer, and the electron blocking layer and so on can also be arranged between the anode and the quantum dots light-emitting layer, and hole functional layers such as the electron transport layer, the electron injection layer, and the hole blocking layer and so on can also be arranged between the cathode and the quantum dots light-emitting layer.

In the above step 10, for the positive structure device, the bottom electrode provided on the substrate is the anode. In an embodiment of the present application, the base plate may be the bottom electrode provided on the substrate and the quantum dots light-emitting layer provided on the surface of the bottom electrode. In another embodiment of the present application, the base plate may include a substrate, a bottom electrode stacked on the surface of the substrate, a hole transport layer stacked on the surface of the substrate, and a quantum dots light-emitting layer arranged on the surface of the hole transport layer; in another embodiment of the present application, the base plate may include a substrate, a bottom electrode stacked on the surface of the substrate, and a hole injection layer stacked on the surface of the substrate, a hole transport layer stacked on the surface of the hole injection layer, and a quantum dots light-emitting layer arranged on the surface of the hole transport layer; in another embodiment of the present application, the base plate may include a substrate, a bottom electrode stacked on the surface of the substrate, a hole injection layer stacked on the surface of the substrate, a hole transport layer stacked on the surface of the hole injection layer, an electron blocking layer stacked on the surface of the hole transport layer, an electron blocking layer stacked on the surface of the hole injection layer and a quantum dots light-emitting layer arranged on the surface of the electron blocking layer.

Regarding to the inverse structure device, the bottom electrode provided on the substrate is a cathode. In an embodiment of the present application, the base plate can provide a bottom electrode on the substrate; in another embodiment of the present application, the base plate may include a substrate, a bottom electrode stacked on the surface of the substrate, an electron transport layer stacked on the surface of the substrate, and a quantum dots light-emitting layer arranged on the surface of the electron transport layer; in another implementation of the present application, the base plate may include a substrate, a bottom electrode stacked on the surface of the substrate, an electron injection layer stacked on the surface of the substrate, a hole transport layer stacked on the surface of the electron injection layer and a quantum dots light-emitting layer arranged on the surface of the electron transport layer; in another embodiment of the present application, the base plate may include a substrate, a bottom electrode stacked on the surface of the substrate, and an electron injection layer stacked on the surface of the substrate, an electron transport layer stacked on the surface of the electron injection layer, a hole blocking layer stacked on the surface of the electron transport layer and a quantum dot light emitting layer arranged on the surface of the hole blocking layer.

Specifically, in the above step 10, providing the base plate disposed with the bottom electrode, that is, the bottom electrode is provided on the base plate. The selection of the base plate is not strictly limited, and a rigid base plate such as a glass base plate can be used; a flexible base plate such as a polyimide base plate and a polynorbornene base plate can also be used, but it is not limited thereto. The bottom electrode is an electrode opposite to the top electrode, and the bottom electrode may be a cathode or an anode. Specifically, when the bottom electrode is an anode, the top electrode is a cathode; when the bottom electrode is a cathode, the top electrode is an anode. In some embodiments, the anode may be ITO, but it is not limited thereto. In some embodiments, the cathode may be a metal electrode, including but not limited to a silver electrode or an aluminum electrode. The thickness of the cathode is 60-120 nm, and in some embodiments of the present application, it is 100 nm.

The method for preparing the quantum dots light-emitting layer on the bottom electrode is not strictly limited, and the conventional methods in the art can be used to prepare the quantum dots light-emitting layer. In some embodiments, a solution processing method is used to deposit a quantum dots solution on the bottom electrode to prepare the quantum dots light-emitting layer. The quantum dots light-emitting layer prepared by the solution processing method is subjected to the ultrasonic processing in a specific solvent system through the following steps, and the remaining quantum dot impurities and solvent impurities (especially the residual high-boiling solvent) in the quantum dots light-emitting layer can be further removed at the same time, which significantly improves the de-doping effect of the quantum dots light-emitting layer. In some embodiments of the present application, an inkjet printing method is used to deposit quantum dots ink on the bottom electrode to prepare the quantum dots light-emitting layer. In the embodiments of the present application, the quantum dots in the quantum dots light-emitting layer are conventional quantum dots in the art. In some embodiments, the thickness of the quantum dots light-emitting layer is 30-50 nm.

In the above step 20, the quantum dots light-emitting layer is immersed in a solvent system for the ultrasonic processing. Through the ultrasonic processing, the dopant solvent present in a trace amount in the solvent system penetrates into the quantum dots light-emitting layer to dissolve impurities in the quantum dots light-emitting layer (impurities introduced by the quantum dot itself and/or impurities formed by solvent residues), thereby, the influence of residual impurities on the luminous efficiency and service life of the quantum dots light-emitting diode is removed, and the luminous efficiency and service life of the quantum dots light-emitting diode are finally improved.

In the embodiment of the present application, the quantum dots light-emitting layer is immersed in the solvent system for the ultrasonic processing, and the quantum dots light-emitting layer is ultrasonically processed to remove impurities. For ease of operation, in some embodiments, the entire base plate prepared with the quantum dots light-emitting layer is placed in the solvent system for the ultrasonic processing.

In the embodiment of the present application, the solvent system includes the host solvent and the doping solvent dissolved in the host solvent to form a uniform solvent system. The polarity of the doping solvent is less than the polarity of the host solvent, and the host solvent is an organic solvent that does not dissolve quantum dots. The solvent system thus formed can effectively remove residual impurities in the quantum dots light-emitting layer. The host solvent does not dissolve the light-emitting layer, the doping solvent can dissolve the quantum dots light-emitting layer, and the low-concentration doping solvent in the host solvent can dissolve relatively low-molecular-weight impurities without destroying the film formation of the light-emitting layer nanoparticles.

In some embodiments, the host solvent is one or a combination of two selected from a group consisting of alcohols with less than 20 carbon atoms in a straight chain, esters with less than 20 carbon atoms in a straight chain, and ketones with less than 20 carbon atoms in a straight chain.

In some embodiments, the alcohols with less than 20 carbon atoms in the straight chain is one or more selected from a group consisting of 1-propanol, 1-butanol, 1-pentanol, 2-pentanol, 1,5-pentanediol, and 2,3-butanediol. In some embodiments, the esters with less than 20 carbon atoms in the straight chain is one or more selected from a group consisting of ethyl acetate, ethyl propionate, ethyl methacrylate, and ethyl benzoate. In some embodiments, the ketones with less than 20 carbon atoms in the straight chain is one or more selected from a group consisting of acetone, methyl ethyl ketone, 3-pentanone, and 2-methyl 4-octanone. In some embodiments, the alcohol derivative with less than 10 carbon atoms in the straight chain is one or more selected from a group consisting of methoxyethanol, ethoxyethanol, and ethyl mandelate. In some embodiments, the doping solvent is one or more selected from a group consisting of unsaturated fatty acids with less than 10 carbon atoms in the straight chain, alcohol derivatives with less than 10 carbon atoms in the straight chain, saturated acids with less than 10 carbon atoms in the straight chain, acid derivatives with less than 15 carbon atoms in the straight chain, and halogenated hydrocarbons with less than 20 carbon atoms in the straight chain.

In the embodiment of the present application, the polarity of the solute is less than or equal to the polarity of the host solvent, and it can even have a certain solubility for the quantum dots. However, after it is mixed with the host solvent to form a solution, since the addition amount is extremely low, which does not cause the dissolution of the quantum dots.

In some embodiments, the unsaturated fatty acids with less than 10 carbon atoms in the straight chain is one or more selected from a group consisting of acrylic acid, crotonic acid, methacrylic acid, and 3-pentenoic acid. In some embodiments, the alcohol derivatives with less than 10 carbon atoms in the straight chain is one or more selected from a group consisting of methoxyethanol, ethoxyethanol, phenoxyethanol and 1-methoxy-1,2-propanediol. In some embodiments, the saturated acids with less than 10 carbon atoms in the straight chain is one or more selected from a group consisting of acetic acid, propionic acid, butyric acid, and valeric acid. In some embodiments, the acid derivatives with less than 15 carbon atoms in the straight chain is one or more selected from a group consisting of perfluorooctanoic acid, perfluorodecylphosphonic acid, and perfluorododecanoic acid. In some embodiments, the halogenated hydrocarbons with less than 20 carbon atoms in the straight chain is one or more selected from a group consisting of fluoropropane, 1-chlorobutane, and 1-chloropropane, and 3-fluorohexane.

On the basis of the foregoing embodiments, when taking a total weight of the solvent system as 100% in count, a weight percentage of the doping solvent is 0-0.5%, but not including 0. If the content of the low-polarity doping solvent in the solvent system is too high, part of the quantum dots in the quantum dots light-emitting layer may be dissolved, thereby affecting the function of the quantum dots light-emitting layer. In some embodiments of the present application, the weight percentage of the doping solvent is 0.001-0.05%.

In some embodiments, in the step of immersing the quantum dots light-emitting layer in a solvent system to perform the ultrasonic processing, the frequency of the ultrasonic processing is ranged from 20 kHz to $10^9$ kHz. If the frequency of the ultrasonic processing is too high, it will affect the stability of the formed film layer including the quantum dots light-emitting layer, and the film layer is easily detached from the base plate, thereby destroying the stability of the device structure. If the frequency of the ultrasonic processing is too low, the effect of removing impurities in the quantum dots light-emitting layer is not obvious, and the effect of improving the service life and luminous efficiency of the quantum dots light-emitting diode is not significant. In some embodiments, in the step of immersing the quantum dots light-emitting layer in a solvent system to perform the ultrasonic processing, the frequency of the ultrasonic processing is ranged from 20 kHz to 100 kHz.

In some embodiments, in the step of immersing the quantum dots light-emitting layer in a solvent system to perform the ultrasonic processing, the power density of the ultrasonic processing is ranged from 0.3 to 200 w/cm$^2$. If the power density of the ultrasonic processing is too high, it will affect the stability of the formed film layer including the quantum dots light-emitting layer, and the film layer is easily detached from the base plate, thereby destroying the stability of the device structure. If the power density of the ultrasonic processing is too low, the effect of removing impurities in the quantum dots light-emitting layer is not obvious, and the effect of improving the service life and luminous efficiency of the quantum dots light-emitting diode is not significant. In some embodiments, in the step of immersing the quantum dots light-emitting layer in a solvent system to perform the ultrasonic processing, the power density of the ultrasonic processing is ranged from 5 to 100 w/cm$^2$.

In some embodiments, in the step of immersing the quantum dots light-emitting layer in a solvent system to perform the ultrasonic processing, the duration of the ultrasonic processing time is ranged from 20 minutes to 48 hours. If the duration of the ultrasonic processing is too long, the long-term ultrasonic processing will affect the stability of the formed film layer including the quantum dots light-emitting layer, and the film layer is easily detached from the base plate, thereby destroying the stability of the device structure. If the time of the ultrasonic processing is too short, a better effect of removing impurities in the quantum dots light-emitting layer cannot be achieved. In some embodiments of the present application, in the step of immersing the quantum dots light-emitting layer in a solvent system to perform the ultrasonic processing, the duration of the ultrasonic processing time is ranged from 1 hour to 10 hours.

In the above step 20, the top electrode is prepared on the surface of the quantum dots light-emitting layer after ultrasonic processing away from the bottom electrode, which can be prepared by the conventional methods in the art. It is noted that the top electrode described in the embodiment of the present application is an electrode opposite to the bottom electrode, and specifically may be an anode or a cathode.

Thus, the embodiments of the present application prepare the quantum dots light-emitting diode with a basic structure (including a cathode and an anode disposed oppositely, and the quantum dots light-emitting layer disposed between the cathode and the anode). In order to obtain better device performance, the functional layers with different roles can be introduced on the basic structure of the quantum dots light-emitting diode to balance carriers.

In some embodiments, when the bottom electrode is an anode, that is, when the anode is set on the base plate to form an anode base plate, before preparing the quantum dots light-emitting layer, it further includes the step of preparing a hole functional layer on the anode surface of the base plate (the hole functional layer is disposed between the anode and the quantum dots light-emitting layer). The hole functional layer comprises at least one layer selected from a group consisting of a hole injection layer, a hole transport layer, and an electron blocking layer. Among them, the hole injection layer and the hole transport layer are used to reduce the difficulty of hole injection, and the electron blocking layer is used to block excess electrons so that the excess electrons cannot reach the anode to form a leakage current, thereby improving the current efficiency of the quantum dot light emitting diode. In some embodiments of the present application, when the anode is disposed on the base plate to form an anode base plate, before preparing the quantum dots light-emitting layer, the method further includes the steps of preparing a hole injection layer on the anode surface of the base plate, and preparing a hole transport layer on the side of the hole injection layer away from the anode. Among them, the material of the hole injection layer can be a conventional hole injection material, including but not limited to PEDOT:PSS. The material of the hole transport layer can be conventional hole transport materials, including but not limited to organic materials such as NPB and TFB, and inorganic materials such as NiO, $MoO_3$ and their composites. The thickness of the hole transport layer is ranged from 10 to 100 nm.

In some embodiments, when the bottom electrode is an anode, that is, when the anode is disposed on the base plate to form an anode base plate, after preparing the quantum dots light-emitting layer and before preparing the cathode, the method further includes the step of preparing an electron function layer (the electron function layer is arranged between the cathode and the quantum dots light-emitting layer) on one side of the quantum dots light-emitting layer away from the anode. The electron function layer includes at least one of an electron injection layer, an electron transport layer, and a hole blocking layer. Among them, the electron injection layer and the electron transport layer are used to reduce the difficulty of electron injection, and the hole blocking layer is used to block excess holes so that the excess holes cannot reach the cathode to form a leakage current, thereby improving the current efficiency of the quantum dots light-emitting diode. In some embodiments of the present application, when the anode is disposed on the base plate to form the anode base plate, after the quantum dots light-emitting layer is prepared, and before the cathode is prepared, the method further includes the step of preparing an electron transport layer on the side of the quantum dot light-emitting layer away from the anode, and preparing an electron injection layer on the side of the electron injection layer away from the anode. Among them, the material of the electron injection layer can be a conventional electron hole injection material, including but not limited to LiF, CsF, and the thickness of the electron transport layer is ranged from 10 to 100 nm. The material of the electron transport layer can be a conventional electron transport material, including but not limited to n-type zinc oxide, and the thickness of the electron transport layer is ranged from 10 to 100 nm.

In some embodiments, when the bottom electrode is a cathode, that is, when the cathode is disposed on the base plate to form a cathode base plate, before preparing the quantum dots light-emitting layer, the step of preparing an electron function layer on the cathode surface of the base plate is further included. The electron function layer includes at least one layer selected from a group consisting of an electron injection layer, an electron transport layer, and a hole blocking layer. In some embodiments of the present application, when the cathode is disposed on the base plate to form the cathode base plate, and before preparing the quantum dots light-emitting layer, the method further includes the steps of preparing the electron injection layer on the cathode surface of the base plate, and preparing the electron transport layer on the side of the electron injection layer away from the cathode.

In some embodiments, when the bottom electrode is a cathode, that is, when the cathode is disposed on the base plate to form a cathode base plate, after preparing the quantum dots light-emitting layer and before preparing the anode, the method further includes the step of preparing a hole functional layer on one side of the quantum dots light-emitting layer away from the cathode. The hole function layer includes at least one of a hole injection layer, a hole transport layer, and an electron blocking layer. In some embodiments of the present application, when the cathode is disposed on the base plate to form the cathode base plate, after preparing the quantum dots light-emitting layer and before preparing the anode, the method further includes the steps of preparing the hole transport layer on the side of the quantum dots light-emitting layer away from the cathode, and preparing the hole injection layer on the side of the hole transport layer away from the cathode.

For the preparation of the above-mentioned electron function layer and hole functional layer, refer to the preparation of conventional methods in the art. In some embodiments of the present application, the solution processing method is adopted to obtain the preparation.

The description will be given below in conjunction with specific embodiments.

Embodiment 1

A method for preparing the quantum dots light-emitting diode includes the following steps:
providing a base plate provided with an anode (ITO), preparing a hole injection layer (PEDOT:PSS) on the anode, preparing a hole transport layer (TFB) on the side of the hole injection layer away from the anode, and preparing a quantum dots light-emitting layer (CdSe/ZnS QDs) on the side of the hole transport layer away from the anode;
immersing the quantum dots light-emitting layer in the 1-butanol solution with the 1-chlorobutane content of 1 ppm, and ultrasonic processing for 100 minutes at a power of 20 kHz; and preparing an electron transport layer (ZnO) on the surface of the quantum dots light-emitting layer after ultrasonic processing away from the anode, preparing an electron injection layer (LiF) on the surface of the electron transport layer away from the anode, and preparing an aluminum cathode on the surface of the electron injection layer away from the anode.

Embodiment 2

A method for preparing the quantum dots light-emitting diode. The difference from Example 1 is that immersing the quantum dots light-emitting layer in the 1-butanol solution with the 1-chlorobutane content of 100 ppm, and ultrasonic processing for 100 minutes at a power of 20 kHz.

Comparative Example 1

A method for preparing the quantum dots light-emitting diode. The difference from Example 1 is that immersing the quantum dots light-emitting layer in the 1-butanol solution with the 1-chlorobutane content of 100 ppm, and ultrasonic processing for 300 minutes at a power of 20 kHz.

Comparative Example 2

A method for preparing the quantum dots light-emitting diode. The difference from Example 1 is that immersing the quantum dots light-emitting layer in the 1-butanol solution, and ultrasonic processing for 100 minutes at a power of 20 kHz.

Comparative Example 3

A method for preparing the quantum dots light-emitting diode. The difference from Example 1 is that directly preparing an electron transport layer (ZnO) on the surface of the prepared quantum dots light-emitting layer, preparing an electron injection layer (LiF) on the surface of the electron transport layer away from the anode, and preparing an aluminum cathode on the surface of the electron injection layer away from the anode. That is, the step of "immersing the quantum dots light-emitting layer in the 1-butanol solution with the 1-chlorobutane content of 1 ppm, and ultrasonic processing for 100 minutes at a power of 20 kHz" is not performed.

The changes (%) of the external quantum efficiency of the quantum dots light-emitting diodes prepared in the embodiments 1-2 and the Comparative Examples 1-3 are respectively tested after energization and curing, and the results are shown in Table 1 below.

TABLE 1

| External quantum efficiency (%) | Composition ratio of solvent system $m_{1\text{-}chlorobutane}$: $m_{1\text{-}butanol}$ | 1 day later | 2 days later | 3 days later | 4 days later |
| --- | --- | --- | --- | --- | --- |
| Embodiment 1 | 1 ppm | 3.3 | 5.5 | 7.0 | 7.6 |
| Embodiment 2 | 100 ppm | 3.7 | 6.5 | 8.1 | 7.9 |
| Comparative example 1 | 300 ppm | 2.8 | 4.9 | 6.0 | 5.4 |
| Comparative example 2 | 0 ppm | 2.9 | 4.9 | 6.3 | 7.0 |
| Comparative example 3 | — | 3.0 | 4.7 | 5.9 | 5.5 |

It can be seen from Table 1 that when the mass ratio of the 1-chlorobutane content in the 1-butanol solution is within a certain range, the external quantum efficiency of the device after ultrasonic processing can be effectively improved. In particular, when the mass ratio of 1-chlorobutane in 1-butanol is 100 ppm, the highest value of the external quantum efficiency of the quantum dots light-emitting diode is increased by 37.3%.

Embodiment 3

A method for preparing the quantum dots light-emitting diode includes the following steps:

providing a base plate provided with an anode (ITO), preparing a hole injection layer (PEDOT:PSS) on the anode, preparing a hole transport layer (TFB) on the side of the hole injection layer away from the anode, and preparing a quantum dots light-emitting layer (CdSe/ZnS QDs) on the side of the hole transport layer away from the anode;

immersing the quantum dots light-emitting layer in the solvent system of embodiment 3 in Table 2 below, and ultrasonic processing for 100 minutes at a power of 20 kHz; and preparing an electron transport layer (ZnO) on the surface of the quantum dots light-emitting layer after ultrasonic processing away from the anode, preparing an electron injection layer (LiF) on the surface of the electron transport layer away from the anode, and preparing an aluminum cathode on the surface of the electron injection layer away from the anode.

Embodiment 4

A method for preparing the quantum dots light-emitting diode. The difference from Example 1 is that immersing the quantum dots light-emitting layer in the solvent system of embodiment 4 in Table 2 below, and ultrasonic processing for 100 minutes at a power of 20 kHz.

Embodiment 5

A method for preparing the quantum dots light-emitting diode. The difference from Example 1 is that immersing the quantum dots light-emitting layer in the solvent system of embodiment 5 in Table 2 below, and ultrasonic processing for 100 minutes at a power of 20 kHz.

Embodiment 6

A method for preparing the quantum dots light-emitting diode. The difference from Example 1 is that immersing the quantum dots light-emitting layer in the solvent system of embodiment 6 in Table 2 below, and ultrasonic processing for 100 minutes at a power of 20 kHz.

The changes (%) of the external quantum efficiency of the quantum dots light-emitting diodes prepared in the embodiments 3-6 and the Comparative Examples 3 are respectively tested after energization and curing, and the results are shown in Table 2 below.

TABLE 2

| External quantum efficiency (%) | Solvent system (V[solute]:V[solvent] = 1:10000) | 1 day later | 2 days later | 3 days later | 4 days later |
|---|---|---|---|---|---|
| Embodiment 3 | 1-chlorobutane in 1-butanol solution | 3.7 | 6.5 | 8.1 | 7.9 |
| Embodiment 4 | pentyl mercaptan methyl benzoate solution | 2.9 | 4.9 | 6.3 | 5.8 |
| Embodiment 5 | acrylic acid in ethyl 2-hydroxy-2-phenylacetate | 23.3 | 6.4 | 8.3 | 7.0 |
| Embodiment 6 | perfluorodecylphosphonic acid in acetone alcohol solution | 3.4 | 5.9 | 7.0 | 6.8 |
| Comparative example 3 | — | 3.0 | 4.7 | 5.9 | 5.5 |

It can be seen from Table 2 that different combinations of solvent systems have different degrees of influence on the external quantum efficiency of quantum dots light-emitting diodes. Specifically, embodiment 3 and embodiment 5 significantly improve the external quantum efficiency of the quantum dots light-emitting diodes; embodiment 4 improves the external quantum efficiency of the quantum dots light-emitting diodes and at the same time increase the curing time for the quantum dots light-emitting diodes to reach the highest external quantum efficiency.

The above are only optional embodiments of the present application, and are not used to limit the present application. For those skilled in the art, the present application can have various modifications and changes. Any modification, equivalent replacement, improvement, etc. made within the spirit and principle of the present application shall be included in the scope of the claims of the present application.

What is claimed is:

1. A method for preparing quantum dots light-emitting diode, comprising following steps:
   providing a base plate, wherein an upper surface of the base plate is provided with a quantum dots light-emitting layer; and
   immersing the base plate in a solvent system to perform an ultrasonic processing, wherein the solvent system comprises: a host solvent and a doping solvent dissolved in the host solvent, a polarity of the doping solvent is less than a polarity of the host solvent, the host solvent is an organic solvent that does not dissolve quantum dots, and the doping solvent is configured to dissolve impurities in the quantum dots light-emitting layer; and
   wherein when taking a total weight of the solvent system as 100% in count, a weight percentage of the doping solvent is 0.001-0.5%.

2. The method of claim 1, wherein the host solvent is one or a combination of two selected from a group consisting of alcohols with less than 20 carbon atoms in a straight chain, esters with less than 20 carbon atoms in a straight chain, and ketones with less than 20 carbon atoms in a straight chain.

3. The method of claim 2, wherein the alcohols with less than 20 carbon atoms in the straight chain is one or more selected from a group consisting of 1-propanol, 1-butanol, 1-pentanol, 2-pentanol, 1,5-pentanediol, and 2,3-butanediol.

4. The method of claim 2, wherein the esters with less than 20 carbon atoms in the straight chain is one or more selected from a group consisting of ethyl acetate, ethyl propionate, ethyl methacrylate, and ethyl benzoate.

5. The method of claim 2, wherein the ketones with less than 20 carbon atoms in the straight chain is one or more selected from a group consisting of acetone, methyl ethyl ketone, 3-pentanone, and 2-methyl 4-octanone.

6. The method of claim 1, wherein the doping solvent is one or more selected from a group consisting of unsaturated fatty acids with less than 10 carbon atoms in the straight chain, alcohol derivatives with less than 10 carbon atoms in the straight chain, saturated acids with less than 10 carbon atoms in the straight chain, acid derivatives with less than 15 carbon atoms in the straight chain, and halogenated hydrocarbons with less than 20 carbon atoms in the straight chain.

7. The method of claim 6, wherein the unsaturated fatty acids with less than 10 carbon atoms in the straight chain is one or more selected from a group consisting of acrylic acid, crotonic acid, methacrylic acid, and 3-pentenoic acid.

8. The method of claim 6, wherein the alcohol derivatives with less than 10 carbon atoms in the straight chain is one or more selected from a group consisting of methoxyethanol, ethoxyethanol, 2-hydroxy-2-phenylacetate, and acetol.

9. The method of claim 6, wherein the saturated acids with less than 10 carbon atoms in the straight chain is one or more selected from a group consisting of acetic acid, propionic acid, butyric acid, and valeric acid.

10. The method of claim 6, wherein the acid derivatives with less than 15 carbon atoms in the straight chain is one or more selected from a group consisting of perfluorooctanoic acid, perfluorodecylphosphonic acid, and perfluorododecanoic acid.

11. The method of claim 6, wherein the halogenated hydrocarbons with less than 20 carbon atoms in the straight chain is one or more selected from a group consisting of fluoropropane, 1-chlorobutane, and 1-chloropropane, and 3-fluorohexane.

12. The method of claim 1, wherein in the step of immersing the base plate in a solvent system to perform the ultrasonic processing, a frequency of the ultrasonic processing is ranged from 20 kHz to 109 kHz.

13. The method of claim 12, wherein in the step of immersing the base plate in a solvent system to perform the ultrasonic processing, the frequency of the ultrasonic processing is ranged from 20 kHz to 100 kHz.

14. The method of claim 1, wherein in the step of immersing the base plate in a solvent system to perform the ultrasonic processing, the power density of the ultrasonic processing is ranged from 0.3 w/cm$^2$ to 200 w/cm$^2$.

15. The method of claim 14, wherein in the step of immersing the base plate in a solvent system to perform the ultrasonic processing, a power density of the ultrasonic processing is ranged from 5 w/cm$^2$ to 100 w/cm$^2$.

16. The method of claim 1, wherein in the step of immersing the base plate in a solvent system to perform the ultrasonic processing, a duration of the ultrasonic processing is ranged from 20 minutes to 48 hours.

17. The method of claim 16, wherein in the step of immersing the base plate in a solvent system to perform the ultrasonic processing, the duration of the ultrasonic processing is ranged from 1 hour to 10 hours.

18. The method of claim 1, wherein the base plate is a base plate provided with a bottom electrode.

19. The method of claim 18, wherein the bottom electrode is an anode, and before preparing the quantum dots light-emitting layer, the method further comprises a step of preparing a hole functional layer on the anode surface of the base plate; and the hole functional layer comprises at least one layer selected from a group consisting of a hole injection layer, a hole transport layer, and an electron blocking layer.

20. The method of claim 18, wherein the bottom electrode is an anode, and before preparing a cathode, the method further comprises a step of preparing an electron function layer on a side of the quantum dots light-emitting layer facing away from the anode; and the electron function layer comprises at least one layer selected from a group consisting of an electron injection layer, an electron transport layer, and a hole blocking layer.

* * * * *